United States Patent [19]
Fandrich et al.

[11] Patent Number: 5,956,742
[45] Date of Patent: *Sep. 21, 1999

[54] METHODS FOR QUEUING AND ABSORBING ERASE COMMANDS IN A NONVOLATILE MEMORY DEVICE

[75] Inventors: Mickey Lee Fandrich, Placerville; Richard Joseph Durante, Citrus Heights; Geoffrey Alan Gould, El Dorado Hills; Timothy Wade Goodell, Elk Grove, all of Calif.

[73] Assignee: Intel Corporation, Santa Clara, Calif.

[ * ] Notice: This patent is subject to a terminal disclaimer.

[21] Appl. No.: 08/818,957

[22] Filed: Mar. 14, 1997

Related U.S. Application Data

[63] Continuation of application No. 08/143,293, Oct. 26, 1993, abandoned.

[51] Int. Cl.[6] .............................. G06F 12/00; G06F 9/46; G11C 16/02
[52] U.S. Cl. .......................... 711/103; 711/158; 711/167; 395/595; 395/736; 395/737
[58] Field of Search ..................... 395/430, 494, 395/485, 405, 874, 739, 738, 737, 736, 735, 733, 292, 591, 595, 559; 365/185.11, 185.29, 185.33, 218; 711/103, 167, 158, 5

[56] References Cited

U.S. PATENT DOCUMENTS

| 4,752,871 | 6/1988 | Sparks et al. ...................... | 365/185.11 |
| 5,034,922 | 7/1991 | Burgess ............................... | 365/189.07 |
| 5,224,070 | 6/1993 | Fandrich et al. .................... | 365/185.33 |

(List continued on next page.)

FOREIGN PATENT DOCUMENTS

| 42 33 248 A 1 | 5/1993 | Germany . |
| 2 215 155 | 9/1989 | United Kingdom . |
| 2 235 999 | 3/1991 | United Kingdom . |

OTHER PUBLICATIONS

Patent Abstracts of Japan, vol. 18, No. 436 (P–1786), Publication Date: May 13, 1994, for JP G–131889, May 13, 1994.

*Primary Examiner*—Glenn Gossage
*Attorney, Agent, or Firm*—Blakely, Sokoloff, Taylor & Zafman

[57] ABSTRACT

A method of queuing erase commands for a nonvolatile memory utilizes placeholder commands to prevent the depth of an operation queue from limiting the number of block erase commands that can be queued at one time. The method includes the step of storing a first erase command in the operation queue. The first erase command is designated as a placeholder erase command if no placeholder command is stored in the operation queue. Each of the first and placeholder erase commands designates at least one block of the nonvolatile memory to be erased. Each block has a corresponding status indicator. If a placeholder erase command is already stored in the operation queue, then 1) the corresponding status indicator for the block designated by the first erase command is set to indicate that the first erase command is an absorbed erase command, and 2) the first erase command is removed from the operation queue. If a program command designating the same block as any of the placeholder and absorbed erase commands is stored in the operation queue, then 1) an erase operation for the same block is performed; 2) the corresponding status indicator for the same block is cleared; and 3) the program command is executed. If the program command does not designate the same block as any of the placeholder and absorbed erase commands, then 1) the program command is executed; and 2) the program command is removed from the operation queue.

18 Claims, 9 Drawing Sheets

U.S. PATENT DOCUMENTS

| | | | |
|---|---|---|---|
| 5,245,572 | 9/1993 | Kosonocky et al. | 365/185.11 |
| 5,287,469 | 2/1994 | Isuboi | 711/103 |
| 5,333,300 | 7/1994 | Fandrich | 711/103 |
| 5,337,281 | 8/1994 | Kobayashi et al. | 365/218 |
| 5,341,330 | 8/1994 | Wells et al. | 365/185.33 |
| 5,353,256 | 10/1994 | Fandrich et al. | 365/185.11 |
| 5,355,464 | 10/1994 | Fandrich et al. | 365/218 |
| 5,369,616 | 11/1994 | Wells et al. | 365/185.33 |
| 5,414,829 | 5/1995 | Fandrich et al. | 711/101 |
| 5,418,752 | 5/1995 | Harari et al. | 365/218 |
| 5,463,757 | 10/1995 | Fandrich et al. | 711/103 |
| 5,509,134 | 4/1996 | Fandrich et al. | 711/103 |

METHODS FOR QUEUING AND ABSORBING ERASE COMMANDS IN A NONVOLATILE MEMORY DEVICE

This is a continuation of U.S. patent application Ser. No. 08/143,293, filed Oct. 26, 1993, now abandoned.

FIELD OF THE INVENTION

The present invention relates to nonvolatile semiconductor memories. In particular, the present invention relates to method and circuitry for storing erase commands in excess of the depth of an operation queue, which stores user commands.

BACKGROUND OF THE INVENTION

One prior nonvolatile semiconductor memory is the flash electrically erasable programmable read-only memory ("flash"). Flash memories are programmed electrically and, once programmed, retain their data until erased. After erasure, flash memories may be programmed with new code or data.

Flash memories differ from conventional electrically erasable programmable read-only memories ("EEPROM") with respect to erasure. Conventional EEPROMS typically use a select transistor for individual byte erasure control. Flash memories, on the other hand, typically achieve much higher densities using single transistor cells. Some prior flash memories are erased by applying a high voltage to the sources of every memory cell in the array simultaneously. This results in the full array erasure.

Flash memory conventions define a logical one as few, if any, electrons stored on the floating gate of a memory cell. Convention also defines a logical zero as many electrons stored on the floating gate of a memory cell. Erasure of the flash memory causes a logical one to be stored in each bit cell. Flash memory cells cannot be overwritten individually from a logical zero to a logical one without prior erasure. However, a flash memory cell can be overwritten individually from a logical one to a logical zero, because this entails simply adding electrons to a floating gate that contains the intrinsic number of electrons associated with the erased state.

The process for erasure, programming and verification of flash memories requires careful control of the voltages required to perform those steps. For example, one prior art flash memory is the 28F008 complementary metal oxide semiconductor ("CMOS") flash memory sold by Intel Corporation of Santa Clara, Calif., which is an 8 megabit flash memory. The flash memory includes a command register to manage electrical erasure and reprogramming. Commands are written for erasure from a controlling microprocessor using standard microprocessor write timings. The command register contents serve as inputs to an internal state machine that controls erasure and programming circuitry.

Typically, only one operation can be performed at a time within a flash memory. This means that high priority commands must await completion of low priority commands that were issued before the high priority command. For example, block erase commands are time consuming and fairly low priority. In contrast, program commands can be executed fairly quickly and are a higher priority than block erase commands. Nonetheless, in prior flash memories, once execution of an erase command begins execution of a program command is delayed until after complete execution of a block erase command.

SUMMARY OF THE INVENTION

An object of the present invention is to provide a method and circuitry which allows a user to treat each block of memory within a nonvolatile memory device as a separate memory device.

Another object of the present invention is to permit a user of a nonvolatile memory device including many blocks of memory to issue block erase commands without regard to whether other blocks of memory are currently being programmed or erased.

A still further object of the present invention is to permit a user of a nonvolatile memory device including many blocks of memory to issue as many erase commands as there are blocks of memory.

Yet another object of the present invention is to allow erase commands to be interrupted to handle subsequently received program commands.

A still further object of the present invention is prioritization of erase commands in response to program command interrupts.

A method of storing and prioritizing among erase commands is described for a nonvolatile memory device. The method prevents the depth of an operation queue responsible for queuing program and erase commands from limiting the number of erase commands that are stored at one time. The first erase command received serves as a placeholder, holding a place within the operation queue for all subsequently received erase commands. All subsequently received erase commands are absorbed and cleared from the operation queue. As a result, the operation queue may receive additional commands and an erase command may be queued for every block of memory within the nonvolatile memory device. Absorbed erase commands can be prioritized in response to subsequently received program commands. Blocks are flagged for priority erasure using a priority register. Additionally, interrupt windows located at safe points permit interruption of erase operations to handle command interrupts.

Other objects, features, and advantages of the present invention will be apparent from the accompanying drawings and the detailed description that follows.

BRIEF DESCRIPTION OF THE FIGURES

The present invention is illustrated by way of example and not limitation in the figures of the accompanying drawings in which references indicate similar elements and in which.

DETAILED DESCRIPTION

I. Overview of a Nonvolatile Memory Device

Figure 1:
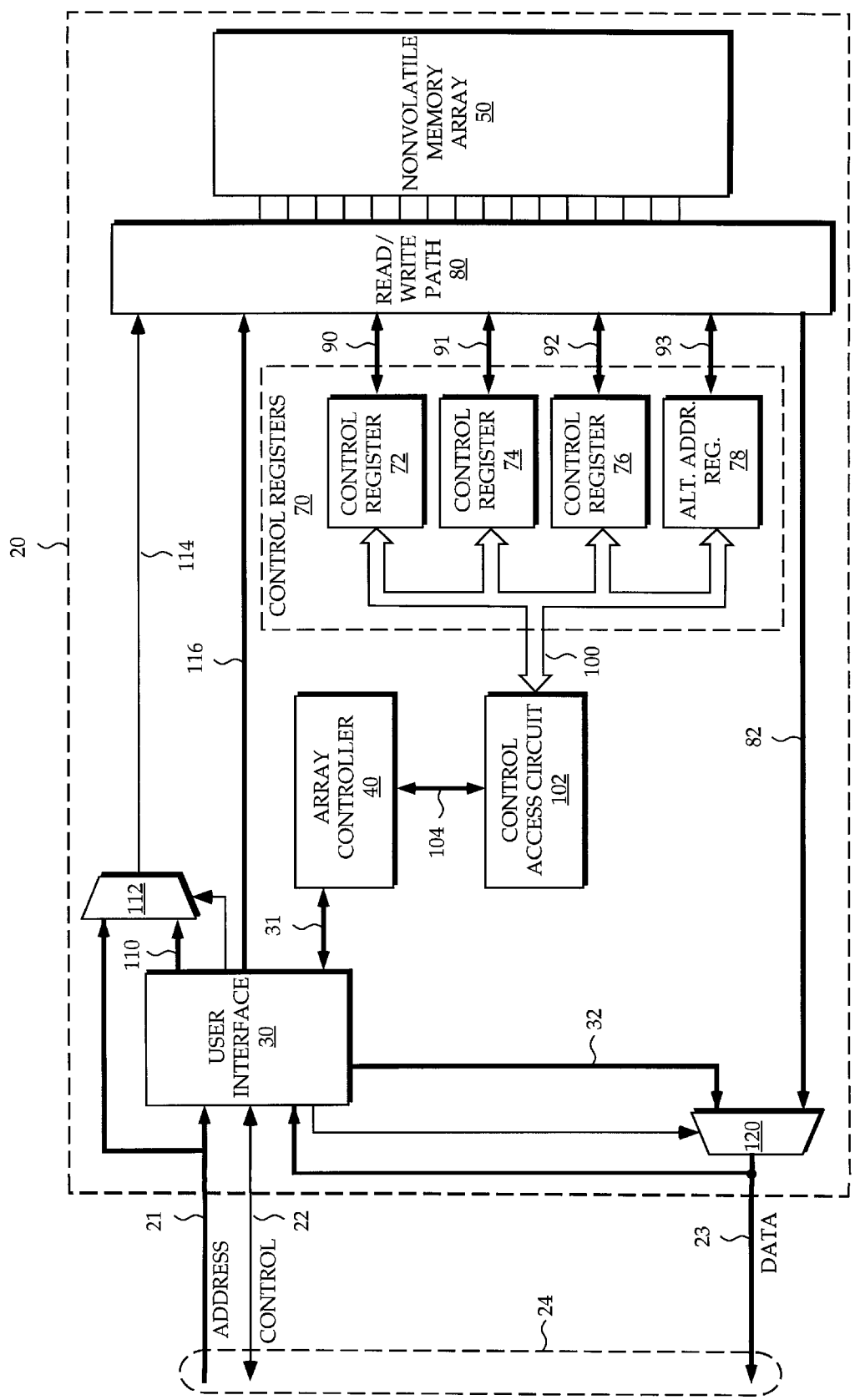
FIG. 1 is a block diagram of a nonvolatile memory device.

FIG. 1 illustrates in block diagram form nonvolatile memory device 20, which incorporates the circuitry of the present invention. Memory device 20 includes user interface 30, array controller 40 and nonvolatile memory array 50. The memory device user communicates commands to memory device 20 via address signals 21, control signals 22 and data signals 23. User interface 30 receives signals 21, 22 and 23 representing the user's commands and decodes them. User interface 30 includes an operation queue that allows memory device 20 to queue multiple user commands, which the operation queue communicates to array controller 40. Array controller 40 executes the indicated commands on the indicated block within nonvolatile memory array 50. Commands executed by array controller 40 include program commands and block erase commands.

As will be described in more detail below, array controller 40 permits nonvolatile memory device 20 to store many more erase commands than can be stored in the operation queue. The process is referred to as "absorption" of an erase command. If no other erase command is pending, the received erase command serves as a placeholder in the operation queue. If, however, the received erase command is subsequent to a pending or in process erase command, the subsequent erase command is removed from the queue.

As will be described below, the array controller uses registers to store the status of each block of the nonvolatile memory so that each block has a corresponding status register. Rather than store the subsequent erase command directly in the operation queue until execution, the status registers are used to store an "absorb bit" for each block. The status of the absorbed bit indicates whether its corresponding block has had an erase command removed from the operation queue, when a placeholder erase command is in the operation queue. Thus an erase command is absorbed by modifying the status of the absorb bit and removing the erase command from the operation queue.

Consider the case of a subsequent block erase command when a block erase operation is pending execution or is currently being executed. In either case the received block erase command will be subsequent to the pending or currently executing block erase command. Therefore the currently pending or executing block erase command serves as a placeholder in the operation queue. If the subsequent block erase command is not absorbed there will be at least two erase commands in the operations queue. Elimination of one of the erase commands provides additional space in the operation queue to receive another command.

For a pending block erase command, a subsequent block erase command is absorbed by updating the status of the absorb bit for a block that the block erase command identifies. The subsequent block erase command is then removed from the operation queue.

If a block erase command is being executed, absorbing a subsequent erase command requires additional steps. Briefly described, array controller 40 provides additional space in the operation queue by interrupting execution of a block erase command to absorb another subsequent block erase command from the operation queue. The subsequent block erase command is then removed from the operation queue, allowing user interface 30 to place additional commands in the operation queue. After completing erasure of a block, array controller 40 checks for absorbed block erase commands, which are then executed. As will also be described in more detail below, array controller 40 prioritizes among absorbed block erase commands in response to program commands and interrupts block erase command execution to execute subsequently queued program commands.

Prior to beginning that detailed discussion, consider again memory device 20. Memory device 20 also includes control registers 70 and read/write path 80. These circuits 70 and 80 in cooperation with user interface 30 and array controller 40, make using memory array 50 relatively simple for the user.

Memory array 50 provides random access, nonvolatile, large scale data storage. Nonvolatile memory array 50 preferably includes 32 blocks of flash memory cells. Each block of memory preferably provides 64k bytes of data storage, which can be separately erased.

User interface 30 functions as an arbiter between the user issuing commands and array controller 40, which executes selected commands. For example, user interface 30 determines if the user's requested operation is valid given the current state of array controller 40. User interface 30 receives as input the command and address information and determines the operation, or command, array controller 40 should execute. (As used herein, command information 24 refers to the combination address signals, data signals 23 and control signals 22 that represent commands.) Furthermore, user interface circuit 30 controls queuing of address and data, user access to status registers, and output multiplexor 120.

User interface 30 enables access to memory array 50 by the user in response to user commands communicated via signals 21, 22 and 23. Upon receipt of a command, user interface 30 stores the address, data and command signals 21, 22 and 23 in internal buffers. If the requested operation is a program or block erase command, the command, address and data signals, 21, 22 and 23 are transferred to array controller 40 via queue bus 31. Address information associated with a command is forwarded by user interface 30 to read/write path 80 via multiplexor 112.

User interface 30 provides two signals, CMDRDY and SUSREQ, to array controller 40 via queue bus 31. CMDRDY indicates that there is at least one more command in the operation queue awaiting execution. SUSREQ informs array controller 40 that there is a pending request to suspend array controller execution.

User interface 30 selects an input address 114 for read/write path 80 via control of input address multiplexor 112. The selected input address is either the address sensed by TTL (transistor-transistor logic) buffers (not shown) on the user address bus 21, or a latched address 110 from user interface 30.

User interface 30 controls output data multiplexor 120 to select a source for output data to the user. That data is transferred over user data bus 23. The selected output data may be either data 82 from read/write path 80, or block status register (BSR) data 32 from a set of block status registers contained within user interface 30. Thus, the user can receive data from memory array 50 as well as status information regarding the state of memory device 20.

Array controller 40 controls the different components needed to program, erase and verify memory array 50. Array controller 40 executes the algorithms, also called services, that sequence the high voltage circuitry of read/write path 80 to apply and remove charge from flash memory cells within memory array 50. Array controller 40 controls the high voltage circuitry and addresses memory array 50 by accessing control registers 70 via central control bus 100.

Array controller 40 provides user interface 30 with a number of status signals via queue bus 31. Array controller 40 provides user interface 30 a signal, RDY, that indicates whether or not array controller 40 is busy or ready to begin executing another command. NXTCMD indicates to user interface 30 whether array controller 40 is executing the command located in the primary queue of the operation queue or an interrupting command located in the secondary queue of the operation queue. OPDONE indicates completion of the command currently being serviced. IDLE indicates that operations have successfully been suspended and the user may take control of memory device 20.

Control access circuit 102 enables array controller 40 access to control registers 70 via central control bus 100. During normal operation, array controller 40 controls control access circuit 102 and thus controls access to control registers 70. Control access circuit 102 passes information to and from array controller 40. Array controller 40 outputs status information to control access circuit 102.

Array controller 40 writes to specialized control registers 70 by transferring a write control signal, and a register address along with corresponding write data to control access circuit 102 via bus 104. Control access circuit 102 then generates a write cycle and couples it to central control bus 100 to write to the addressed control register. Array controller 40 reads control registers 70 by transferring a register address and read control signal to control access circuit over the bus 104. Control access circuit 102 then generates a read access cycle and couples it to central control bus 100 to read the addressed control register.

Control register 72 includes specialized control registers and circuitry for controlling the high voltage circuitry of read/write path 80 according to control signals 90. Control register 74 controls special column access circuitry within read/write path 80 according via control signals 91. Control register 76 includes a set of read only registers for sensing and latching a set of status signals 92 from read/write path 80. Control register 78 controls the read path of read/write path 80 via control signals 93. Because of its function, control register 78 is also called alternate address register 78. Array controller 40 uses alternate address register 78 to address memory array 50 during priority erases, as will be described in more detail herein.

A. The User Interface

Figure 2:
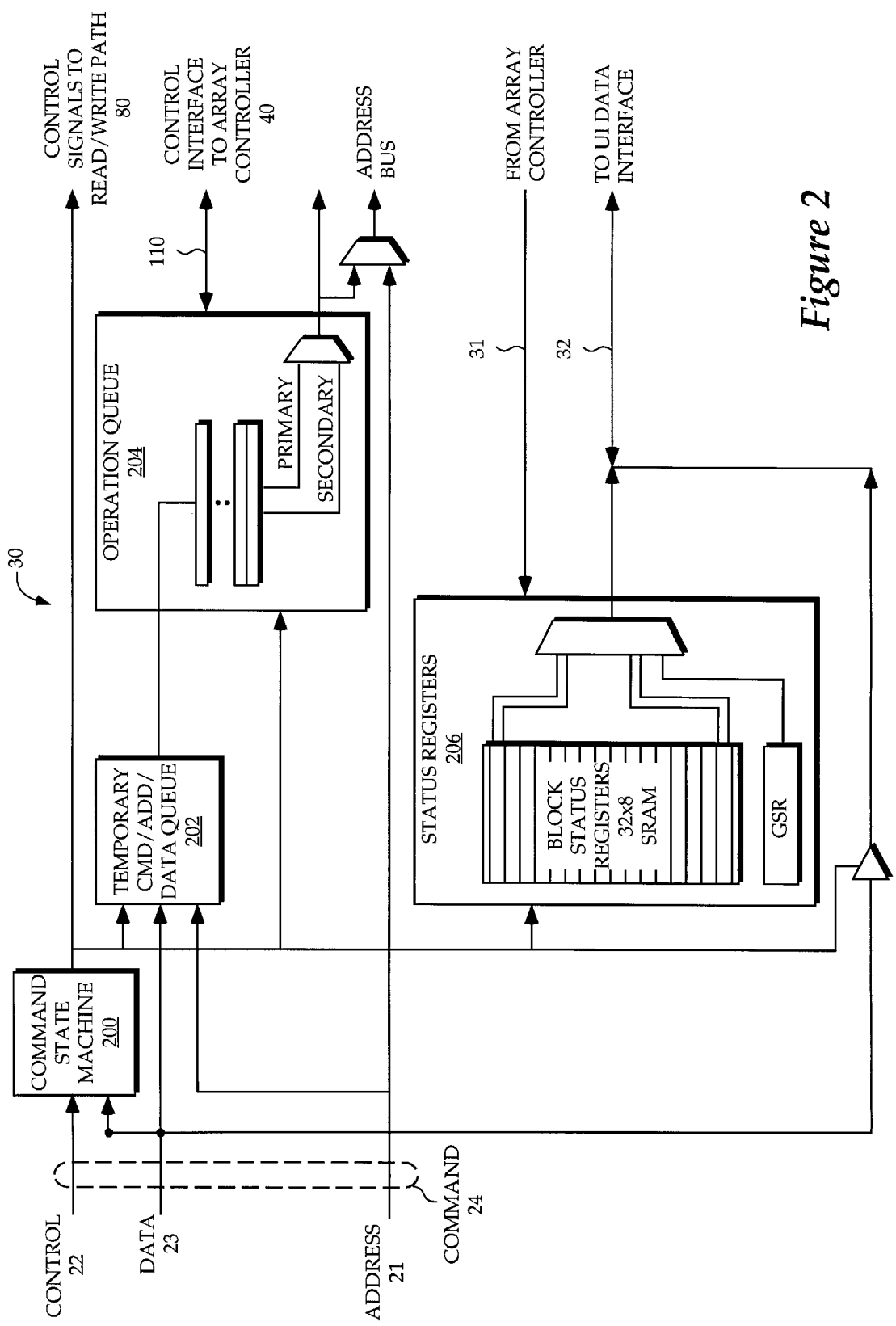
FIG. 2 is a block diagram of the user interface of the nonvolatile memory device.

FIG. 2 illustrates user interface 30 in block diagram form. User interface 30 includes command state machine 200, temporary command/address/data queue 202, operation queue 204 and status registers 206.

Command state machine 200 determines the command to be executed based upon command information received from the user. Command state machine 200 decodes the user's command input and dictates to the rest of memory device 20 the steps to execute that command. Command state machine 200 forwards the command information to array controller 40, if necessary. If a read operation is to be performed, command state machine 200 sends the address to read/write circuitry 80. Command state machine 200 controls the data available at the outputs through the output multiplexor 120 and the inputs to input multiplexor 112. Furthermore, command state machine 200 controls access to status registers 206.

If the requested command is one that is not executed by array controller 40, for example, a read array or read status registers command, user interface 30 issues the appropriate control signals to cause execution of the requested command. If the command request received is one to be executed by array controller 40, the command code representative of the command is used to generate an index into a jump table. The index to the jump table, also called an offset vector, is forwarded to temporary command/address/data queue 202. The offset vector is output to operation queue 204.

If a command is to be executed by array controller 40, then user interface 30 couples the command, address and data information to temporary queue 202 for processing. Once temporary queue 202 receives command, data and address information, it forwards the information to operation queue 204. As array controller commands are provided to command state machine 200, it forwards the commands and address/data information to temporary queue 202. Temporary queue 202 subsequently forwards them to operation queue 204. When operation queue 204 is ready to accept the command into one of its two queues, the command is placed into the active queue of operation queue 204. When command state machine 200 transfers information to temporary queue 202 it also sets a flag to tell operation queue 204 that a command is waiting to be added to an available queue.

The two queues within operation queue 204 are the primary queue and the secondary queue. The primary queue indicates the command to be executed or that is executing. The secondary queue stores the next command to be executed upon completion of the command in the primary queue. Once array controller 40 completes execution of the operation located in the primary queue, that operation is removed from operation queue 204 to permit execution of the next operation. If a command to be executed is stored in temporary queue 202, the offset vector, data and address are transferred to operation queue 204 for subsequent execution. Context switching allows execution of a command stored in the secondary queue before completion of the command stored in the primary queue.

User interface 30 permits three layers of command queuing. For example, when a command received requires an array controller operation and one is not currently executing, user interface 30 loads the primary queue of operation queue 204 with the data for the command and initiates operation of array controller 40. Typically, the secondary queue will be available to receive additional user commands while array controller 40 is executing a command located in the primary queue. Upon receipt of a subsequent command, user interface 30 notifies array controller 40 via assertion of a signal, CMDRDY, that a new command has been placed into queue operation 204. The array controller algorithm that is currently running will determine whether its operation should be interrupted to handle the queued operation.

Figure 3:
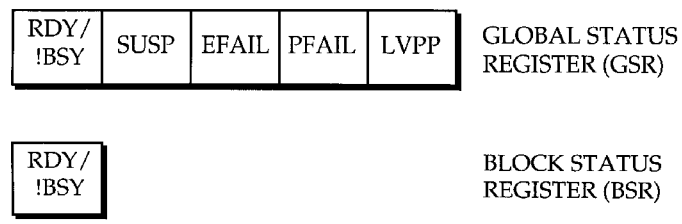
FIG. 3 illustrates bits of a global status register and of block status registers.

Preferably, user interface 30 includes a global status register and a set of 32 block status registers (BSRs), one BSR for each block within memory array 50. FIG. 3 illustrates exemplary status register bit definitions. The global status register represents the status of memory device 20 in general and does not convey any block specific information. Although a failed operation can be detected via the global status register, the actual block in which the failed operation occurred can only be detected by reading the BSRs.

The block status registers (BSRs), only one of which is illustrated, indicate the status of operations performed upon a block via a RDY/!BSY bit. If no operation is currently being performed on a block this will be indicated by the active state, RDY, of the block's RDY/!BSY bit. Analogously, if a block is currently being operated on, this will be indicated by the inactive state, !BSY, of the block's RDY/!BSY bit. User interface 30 can access each block status register to monitor the state of execution of array controller operations. The user can access status registers 206 at any time to determine the state of array controller 40.

B. The Array Controller

Figure 4:
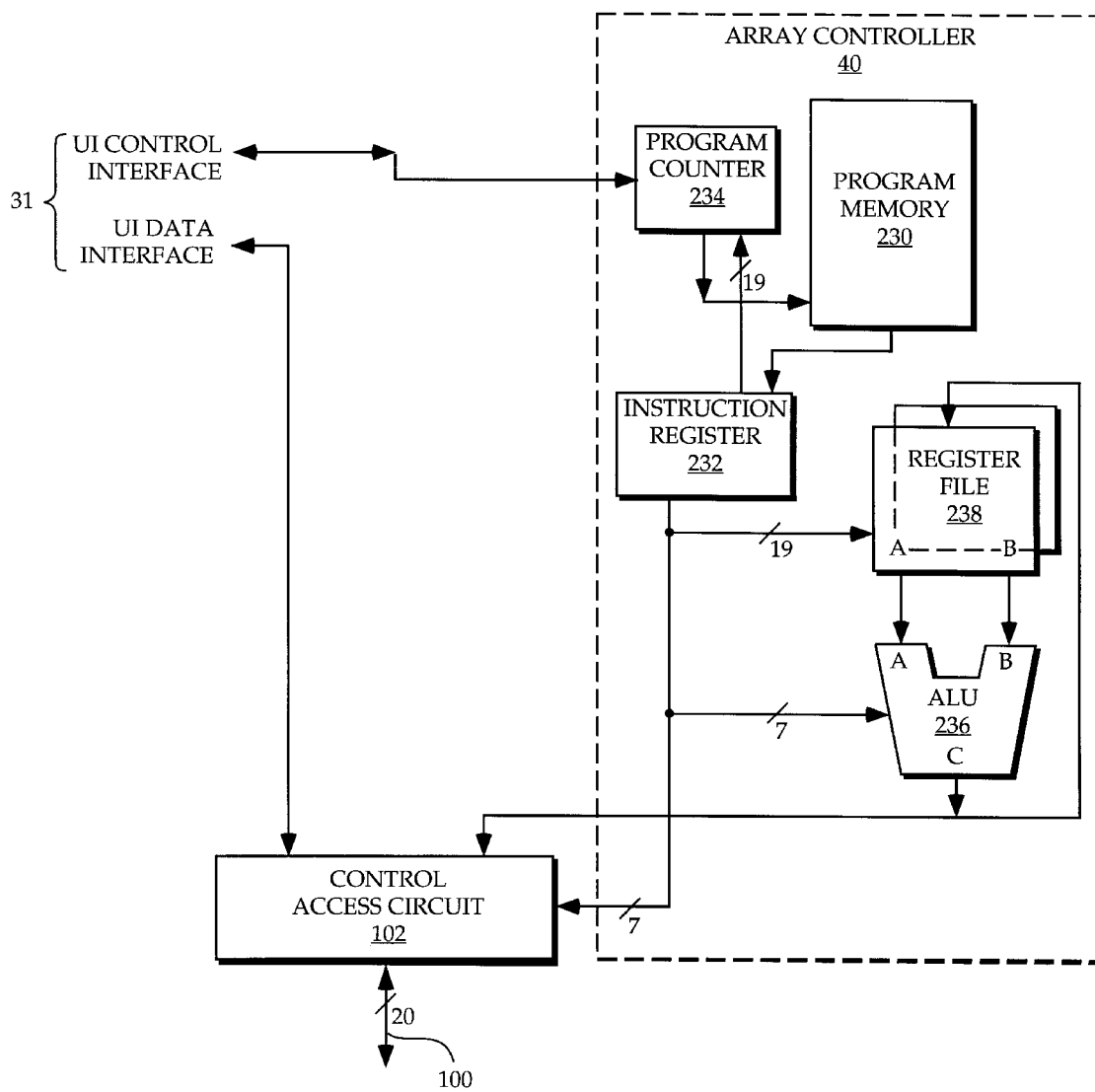
FIG. 4 is a block diagram of the array controller of the nonvolatile memory.

Array controller 40 is a general purpose processing structure. As shown in FIG. 4, array controller 40 includes program memory 230, instruction register 232, program counter 234, arithmetic logic unit (ALU) 236, and register file 238.

Array controller 40 executes algorithms stored in program memory 230. These algorithms comprise instruction words, particularly data transfer instructions, computational instructions, branching instructions and control instructions. Data transfer instructions relate to moving data to and from register file 238. Branching instructions allow programming to modify the flow of an algorithm through the use of subroutine calls and conditional/unconditional jumps. Computational instructions result in operations that involve the arithmetic logic unit 236. Control instructions provide the means for setting or clearing two interrupt flags and setting pointers to the interrupt handling routines.

Algorithms stored in program memory 230 are accessed via jump vectors received from user interface 30 and program addresses. Program addresses are stored in the first 32 addresses of program memory 230. Program memory 230 receives an address at a time from program counter 234. Program memory 230 outputs instructions, an instruction at a time, to instruction register 232, which latches them.

The basic function of program counter 234 is to decode the next instruction to be executed and point to the proper instruction to follow. That is to say, program counter 234 maintains the proper cycling of instructions. Additionally, program counter 234 allows context switching between the primary and secondary queues of operation queue 204 and provides an interrupt structure. The address provided as the output of program counter 234 is used to retrieve the next instruction from program memory 230 for transfer to instruction register 232 and execution by ALU 236.

Program counter 234 allows array controller 40 to switch context during an interrupt to save the array controller's context in a timely manner. Thus, after an interrupt operation is complete, another context switch is performed to restore the original state of the array controller and the original operation can continue.

Program counter 234 includes two registers that aid interrupt handling and context switching. The interrupt start register stores the address of an interrupt start routine. Thus, when interrupt servicing begins, it begins with routine pointed to by the interrupt start register. The second register, the interrupt return register, performs an analogous function. The interrupt return register stores the address of the routine to be returned to after interrupt servicing is complete and the return command, RET, is issued.

ALU 236 performs all arithmetic and logic functions, and will not be discussed in detail herein.

Register file 238 is partitioned into two sections. The first section, identified as the main section, contains variables for the algorithm being executed by array controller 40. The second section contains variables for an interrupting algorithm. Therefore, when servicing an interrupt, register file 238 switches the context of array controller 40 from the main section to the second section. All operations are now performed in the interrupt section of register file 238. All variables held in the main section of register file are maintained but not accessible during interrupt servicing. After the interrupt service, control returns again to the main section.

Register file 238 includes a priority register, which is used to indicate execution of priority erase commands.

C. Interrupt Handling Mechanisms

The architecture of the memory device 20 provides an interrupt mechanism that permits interrupts of array controller algorithms without corruption of data or the high voltage program/erase circuits. The interrupt mechanism protects memory device 20 before servicing the interrupt by taking memory device 20 out of a state that could be damaging to array. For example, if array controller 40 is currently controlling an erase process, the voltages required to erase the array are powered down to avoid damaging memory array 50. After servicing the interrupt, array controller 40 is placed back into a state from which the original executing process can continue.

In particular, the interrupt mechanism provides for the safe interrupt and suspension of the currently executing algorithm by first executing interrupt start routine set by the currently executing algorithm. This interrupt start code safely suspends the currently executing algorithm and performs the context switch of registers and program counter necessary. Once the interrupt start routine has completed execution, the interrupting routine begins execution and, at the end of execution of the interrupting routine, an interrupt return routine is executed to adjust program counter 234 to point to a safe return point in the interrupted code and perform a context switch of registers such that the interrupted routine can continue execution.

This structure permits interruption of an erase operation to execute subsequently received program commands and to absorb subsequently received block erase commands. Erase operations on an array are time consuming. If a block erase operation is currently executing and a program operation is awaiting execution, an interrupt request is generated and the interrupt start routine checks for the appropriateness of the interrupting algorithm, and safely sequences the internal power supplies to an off state prior to execution of the program algorithm.

Preferably, array controller 40 provides two interrupt flags: an operation queue interrupt flag and a master interrupt flag. For an interrupt to be serviced by array controller 40, a command must be pending, indicated by assertion of CMDRDY, and both interrupt flags must be enabled. The operation queue interrupt flag, which is initially in a disabled state, is used within algorithms to locally enable and disable interrupt handling. Thus, an algorithm may have instructions for array controller 40 to enable and disable the operation queue flag at various points during execution of the algorithm, which are respectively interruptable and not interruptable. The operation queue interrupt flag is preferably automatically disabled when a call or return instruction is executed.

The master interrupt flag, which is initially enabled, is used to disable interrupts when an algorithm cannot handle a pending interrupt and to handle priority erase commands.

Preferably instructions issued by array controller 40 control interrupt handling and the interrupt flags. These commands include enable operation queue interrupts (ENI), enable other interrupts (ENGI), disable operation queue interrupts (DSI), disable other interrupts (DSGI) and set interrupt start register (SISR). ENI takes a safe return point to the algorithm as an argument, sets the interrupt return register to this value and sets the operation queue interrupt flag. The master interrupt flag is set by ENGI. DSI simply resets and disables the operation queue interrupt flag. Similarly, DSGI disables the master interrupt flag. SISR takes the address of the interrupt start routine address as an argument and sets the interrupt start register. Upon completion of the interrupt start routines, signified by return instruction, RET, the interrupt acknowledge signal and start signal are asserted. The interrupt algorithm is then executed. Upon completion of the interrupt algorithm signified by RET instruction, the interrupt bit is cleared and a jump to the address stored in the interrupt return register occurs. The interrupted algorithm then continues executing.

Furthermore, the address identifying the safe return point of the interrupted algorithm, the interrupt return routine, may be changed during execution of an algorithm.

Thus, the interrupt return point is updated during execution of the code to point to different return points. This may be accomplished by modifying the interrupt return routine or by updating the interrupt return register to point to different interrupt return routines depending upon the location of execution in the algorithm. For example, in an erase algorithm, the return point for the precondition subroutine would be different than the return point for the erase portion of the algorithm which in turn would be different than the return point for the post-condition subroutine.

II. Erase Command Absorption and Prioritization and Program Command Interrupt Handling A. Overview Given the foregoing description of user interface 30 and array controller 40, consider now the present method of storing erase commands. This method prevents the depth of operation queue 204 from limiting the number of block erase commands stored, or queued, at one time. The first block erase command received serves as a placeholder for all subsequently received block erase commands. All subsequently received block erase commands are absorbed and cleared from operation queue 204. As a result, operation queue 204 remains free to receive additional commands and an erase command may be queued for every block of memory. (As used herein, queuing of erase commands does not imply any particular order of execution. Queuing a command means that the command is stored for execution later.) When there are no further absorbed erase commands awaiting execution, the placeholder erase command is removed from operation queue 204.

The present method also prioritizes among absorbed erase commands in response to program commands as well as interrupting erase command execution to execute a subsequently received program command. As used herein, a priority erase is an erase command that should be executed prior to execution of an interrupting program command. Previously received and absorbed erase commands for a block should be executed prior to a program command for that same block because to do otherwise jeopardizes the integrity of data stored within memory device 20. For example, if the later received program command is executed prior to an earlier received erase command, then the data just programmed will be lost and memory device 20 will not store the data the user desires.

Figure 5:
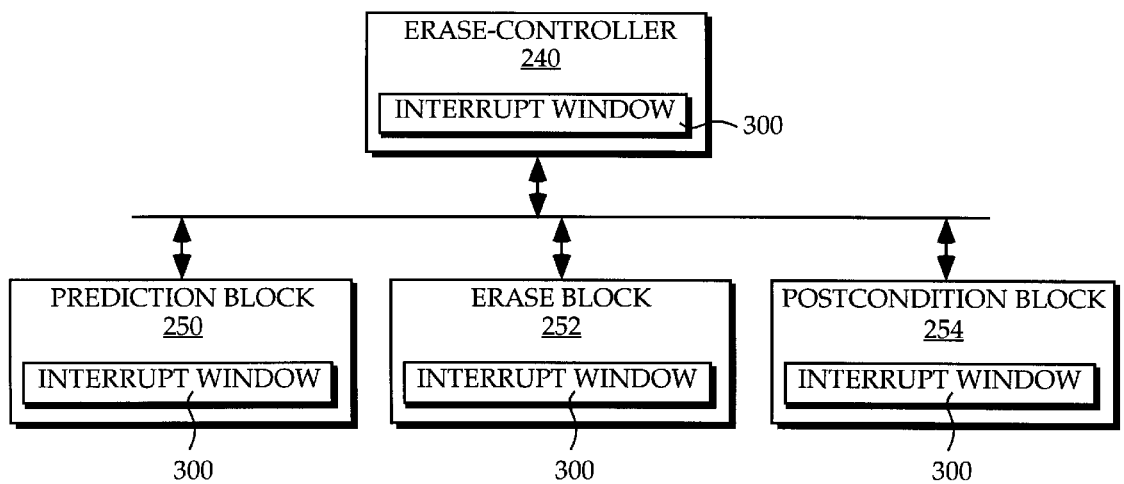
FIG. 5 is an object diagram of the services responsible for erasing a block of memory.

FIG. 5 is an object diagram illustrating the interrelationship between the various services, or algorithms, that control erasure of memory array 50 and perform erase command absorption, queuing and prioritization. These algorithms are stored in program memory 230 of array controller 40.

Erase Controller 240 coordinates the activities necessary to erase memory array 50 a block at a time, to perform priority erasure and to execute absorbed erase commands. Erase Controller 240 relies upon algorithms 250, 252 and 254 to erase memory blocks. Each service 250, 252 and 254 performs a specific task and returns control back to Erase Controller 240. Precondition Block 250 prevents overerasure of memory cells within a block during erasure by raising the threshold voltage of each memory cell to a minimum level. Erase Block 252 erases a block of memory cells and then verifies that each memory cell has an appropriate threshold voltage. Postcondition Block 254 checks for and repairs overerased memory cells within the block of memory just erased.

Services 250, 252 and 254 accomplish their tasks by applying high voltages to a block of memory array 50. Services 240, 250, 252 and 254 handle interrupts from operation queue 204 only at known points during their execution when voltages are at safe levels. Services 240, 250, 252 and 254 include interrupt windows 300 at these safe locations to handle interrupts. Services 240, 250, 252 and 254 each include at least one interrupt window 300. Interrupt windows can only be opened when the master interrupt flag is enabled. Thus, by disabling the master interrupt flag prior to execution of erase controller 240, array controller 40 controls whether erasure occurs without interruption.

Interrupt window 300 responds to interrupts generated by operation queue 204. If the command can be responded to immediately, interrupt window 300 does so. Interrupt window 300 responds immediately to erase commands by absorbing them and enabling operation queue 204 to receive additional commands. Interrupt window 300 responds to program commands by executing them immediately, if possible. If immediate execution of a program command is not possible, then interrupt window 300 ensures speedy execution of any erase command that must precede program command execution.

Figure 6A:
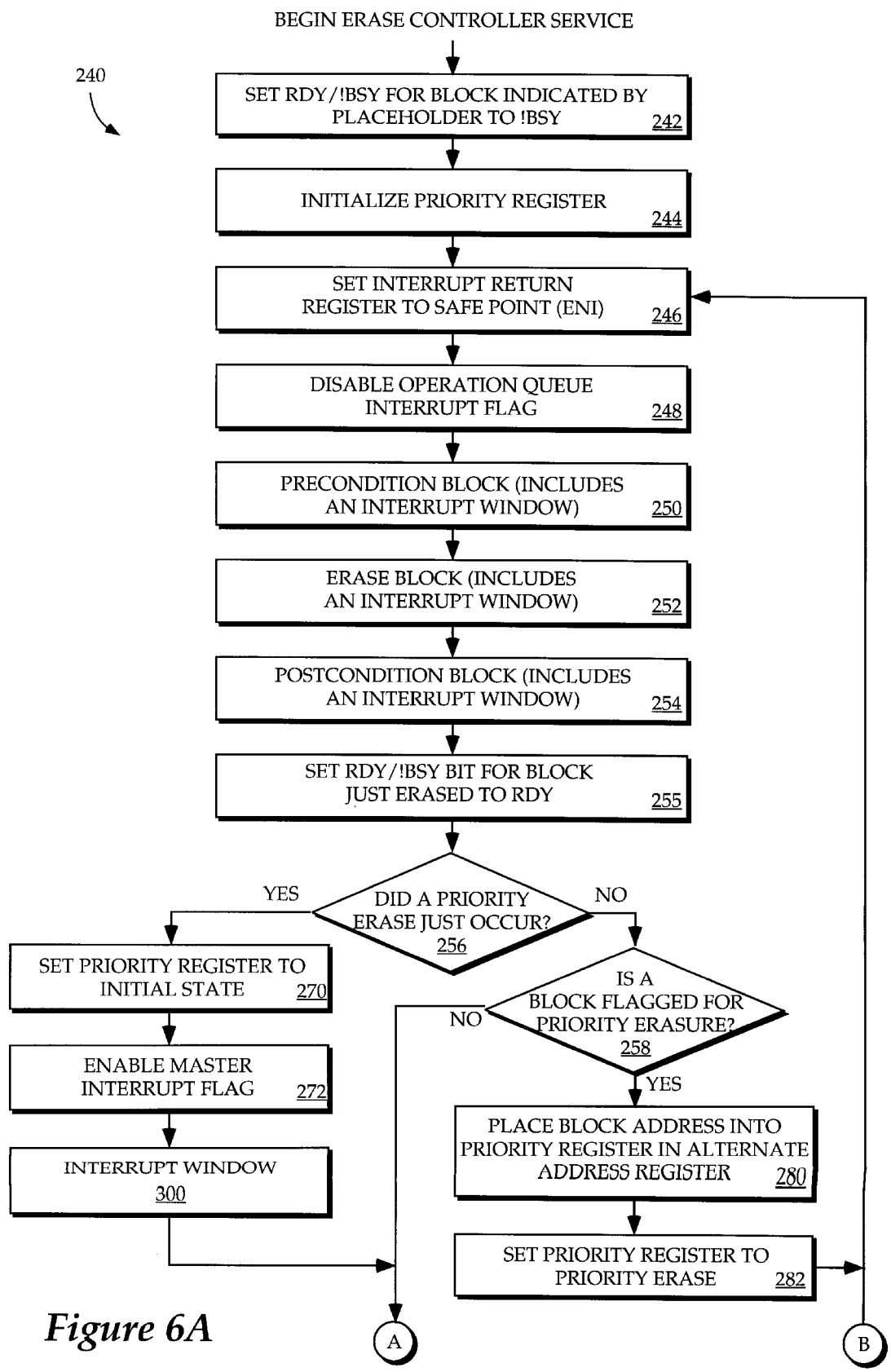
FIG. 6A is a flow diagram of the erase controller service.

Given this overview, consider the flow diagram of FIG. 6, which illustrates the Erase Controller 240 service or algorithm in detail. Execution of Erase Controller 240 begins upon receipt of a block erase command at a time when no other block erase commands are queued, either within operation queue 204 or by absorption. This block erase command serves as a placeholder command for subsequent block erase commands. In response, Erase Controller 240 first performs a number of housekeeping tasks in steps 242–248. Erase Controller 240 begins in step 242 by setting to !BSY the RDY/!BSY bit associated with the block to be erased. This indicates that the block is involved in some operation.

Erase Controller 240 next initializes the priority register within array controller 40 in step 244. Erase Controller 240 uses the priority register to determine whether a priority erase is in progress or just completed. Erase Controller 240 also uses the priority register to flag a block for priority erasure; i.e., for erasure next. Initializing the priority register indicates to Erase Controller 240 that a priority erasure is not in progress and that no block is flagged for erasure next. In one embodiment, the priority register is initialized by setting it to a value of FF (hexadecimal).

Erase Controller 240 advances to step 246 from step 244. During step 246, Erase Controller 240 selects a safe location to return to after interrupt handling and stores the address for this location in the interrupt return register of program counter 234. The chosen return location at this point is step 246. In one embodiment, the interrupt return register is set by issuing an enable interrupt command, ENI, which also enables the operation queue interrupt flag. To prevent any interruption at any but known and safe locations during erase command execution, Erase Controller 240 disables the operation queue interrupt flag in step 248. In one embodiment, Erase Controller 240 does this via a disable operation queue interrupts command DSI.

It is assumed throughout the following discussion that master interrupt flag is initially enabled. However, it need not be. The master interrupt flag can be enabled or disabled by array controller 40 prior to beginning execution of Erase Controller 240. If the master flag is disabled, no interrupts will be handled.

Erase Controller 240 is ready to begin erasing a block of memory after completion of step 248. Erase Controller 240 erases the block associated with the current block erase command in the next three steps using Precondition Block 250, Erase Block 252 and Postcondition Block 254, each of which includes an interrupt window 300. After the block has been erased, Erase controller 240 precedes to step 255 to indicate that the block is now ready and available for other operations. Erase Controller 240 does so by changing the block's RDY/!BSY bit to RDY.

Erase Controller 240 does not immediately clear the erase command from operation queue 204. This first received erase command remains in operation queue 204 as a placeholder for all absorbed erase commands until they all have been executed.

B. Erase Command Absorption and Execution

Figure 6B:
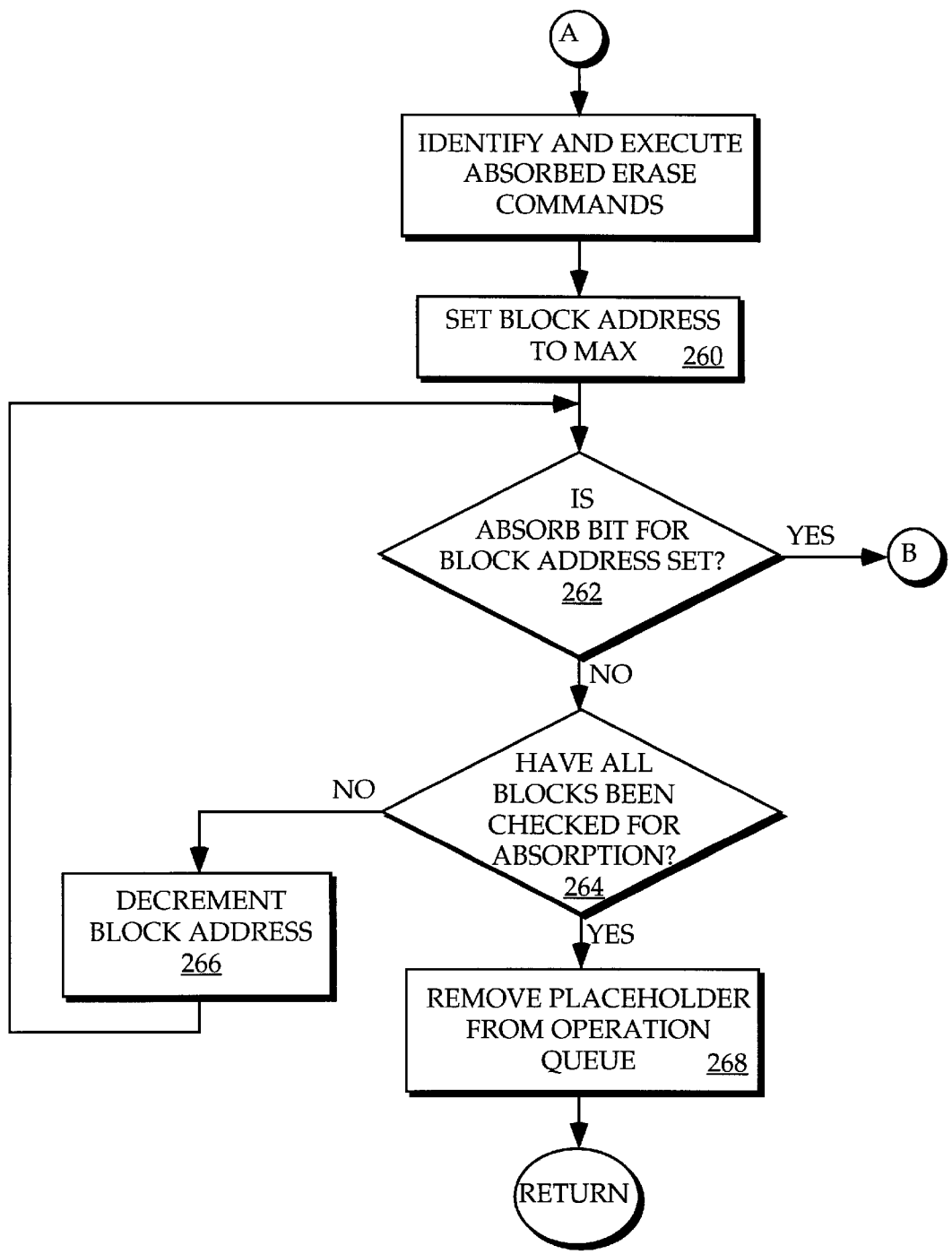
FIG. 6B is a continuation of the flow diagram of FIG. 6A.

Having completed erasure of the first block, Erase Controller 240 is now poised to deal with the effects of any previously received interrupts. Erase Controller 240 first deals with the effects of interrupting program commands in step 256, 258, 280, 282, 270, 272 and 300. This may involve executing a priority erase in steps 258, 280 and 282 or executing the program command in steps 270, 272 and 300, as described below. These tasks complete, Erase Controller 240 turns its attention to identifying and executing absorbed erase commands in steps 260, 262, 264 and 266 (FIG. 6B).

Figure 7A:
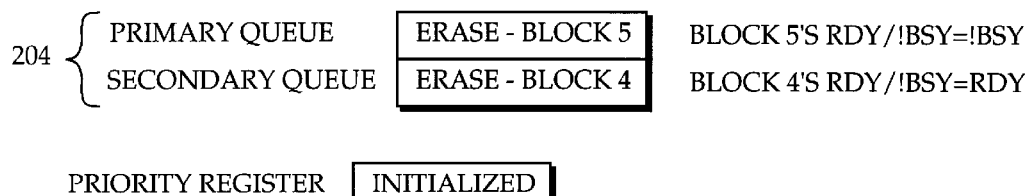
FIG. 7A illustrates the state of the operation queue and the priority register prior to absorption of a block erase command.

The manner in which Erase Controller 240 and Interrupt Window 300 accomplish these tasks can be understood using examples. Consider first how services 240 and 300 absorb erase commands received during the execution of another erase command. FIG. 7A illustrates a situation in which an erase command is absorbed: the user issues a second erase command during the execution of a first erase command. The primary queue stores a command to erase block 5, the placeholder command, which is currently being executed. Block 5's RDY/!BSY bit has been set to !BSY. The secondary queue stores the interrupting command, erase block 4. The presence of the command in the secondary queue is signaled by assertion of the command ready interrupt signal, CMDRDY, by operation queue 204. The first interrupt window 300 reached subsequent to receipt of the command in the secondary queue will handle the interrupt caused by receipt of the command to erase block 4.

Figure 8:
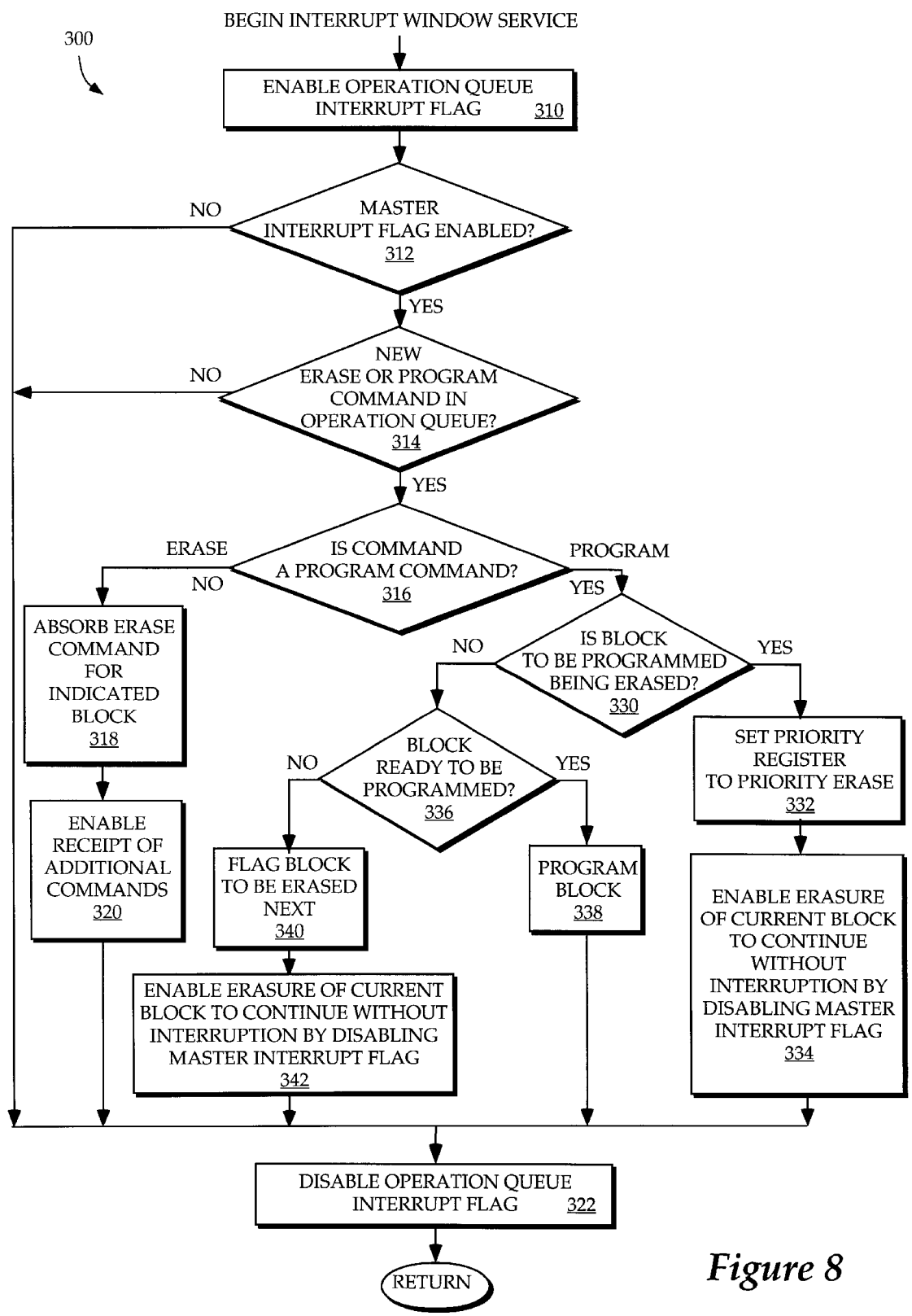
FIG. 8 illustrates in flow diagram form the interrupt window service.

FIG. 8 illustrates in flow diagram form how interrupt window 300 handles command interrupts from operation queue 204. Briefly, interrupt window 300 first determines whether an interrupt can be handled in steps 310 and 312. If the interrupt flags permit, Interrupt Window 300 handles erase command interrupts in steps 314, 316, 318 and 320. Interrupt Window 300 handles program command interrupts in steps 314, 316, 330, 332, 334, 336, 338, 340 and 342. After command interrupts have been handled, Interrupt Window 300 effectively closes the window by preventing operation queue 204 from interrupting erase execution except at another safe location.

Interrupt Window 300 opens a window of time to handle interrupts from operation queue 204 in step 310 by enabling the operation queue interrupt flag. Afterward, it is determined in step 312 whether interrupts can be handled based upon the state of the master interrupt flag. If the master interrupt flag is enabled, then Interrupt Window 300 branches from step 312 to step 314. Erase controller 240 allows the master interrupt flag to remain enabled, so long as there is not a program command within the secondary queue that cannot be executed immediately. According to the current example, the master interrupt flag is enabled because operation queue 204 does not store such a program command. Interrupt Window 300 responds by branching to step 314 from step 312.

Having determined that an interrupt from operation queue 204 can be handled now, Interrupt Window 300 determines during step 314 whether there is a command to handle. Interrupt Window 300 makes this determination based upon the state of CMDRDY. In the current example, CMDRDY is asserted indicating that there is a command in the secondary queue. Interrupt Window 300 responds by proceeding to step 316.

Interrupt Window 300 examines the secondary queue during step 316 to determine the type of command that must be handled. In the current example, the secondary queue contains a command to erase block 4. Interrupt Window 300 therefore branches to step 318.

Figure 7B:
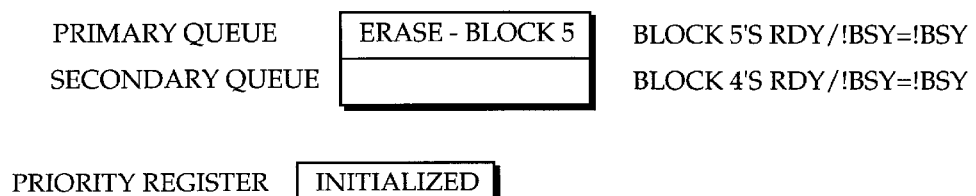
FIG. 7B illustrates the state of the operation queue and the priority register after absorption of a block erase command.

The command to erase block 4 is absorbed during step 318 by setting an absorb bit in block 4's block status register. In one embodiment, block 4's RDY/!BSY bit is used as the absorb bit. Thus, in this embodiment, setting block 4's RDY/!BSY bit to !BSY indicates to the user that block 4 is busy as well as indicating absorption of an erase command for block 4 to array controller 40. Having absorbed the command to erase block 4, Interrupt Window 300 clears the command from the secondary queue (as illustrated in FIG. 7B) in step 320. This enables operation queue 204 to receive yet another command from the user. In this fashion, array controller 40 is able to absorb, and thus to queue, as many erase commands as there are blocks within memory array 50.

Having completed its handling of an interrupting erase command, Interrupt window 300 branches to step 322 from step 320. During step 322 the window of time in which interrupts are handled is closed by disabling the operation queue interrupt flag. This prevents the assertion of CMDRDY from interrupting erase command execution until another Interrupt Window 300 is reached. Interrupt Window 300 then resumes erasure at a point indicated by a value stored in an interrupt return register within array controller 40.

How are absorbed erase commands identified and executed after they have been absorbed? For simplicity's sake, consider again the situation after absorption of the command to erase block 4, which is illustrated in FIG. 7B. Assume further that continued execution of the command to erase block 5 is only interrupted by erase commands, not by program commands. Thus, after execution of step 255 (FIG. 6) of Erase Controller 240, the priority register is still initialized. Because the priority register indicates that a priority erase did not just occur, Erase Controller 240 branches from step 256 to step 258. Erase Controller 240 branches from step 258 to step 260 because the priority register also indicates that no block is flagged for priority erasure.

With step 260, Erase Controller 240 begins the process of identifying and selecting for execution an absorbed erase command. During step 260 the block of memory within memory array 50 with the highest or maximum (max) value address is selected for review. Erase Controller 240 determines in step 262 whether an erase command has been absorbed for the block selected for review. Erase controller 240 accomplishes this task by reading the absorb bit, here the RDY/!BSY bit for the block selected for review. If the RDY/!BSY bit is set to RDY, then an erase command has not been absorbed.

Step 264 determines whether all blocks have been checked for absorbed erase commands. If so, then processing continues with step 268 to remove the placeholder erase command from the operation queue. Otherwise, Erase Controller 240 responds by branching to step 266.

In step 266, another block is selected for review by decrementing the block address from its previous value. Erase Controller 240 then returns to step 262 to examine the absorb bit associated with the newly selected block. The first absorbed erase command identified is executed. Given the example under discussion, Erase Controller 240 will eventually branch from step 262 to step 246 because a command to erase block 4 is flagged by the !BSY state of its RDY/!BSY bit. Erase Controller 240 then places block 4's address in alternate address register 78 (FIG. 1) and begins to execute the command to erase block 4. When erasure of block 4 is complete, Erase Controller 240 will return the RDY/!BSY bit to RDY.

The order in which absorbed block erase commands are selected for execution does not effect the present method of absorbing and executing block erase commands. Other methods of selecting absorbed block erase commands for execution are possible and compatible with the present method.

C. Program Command Interruption of Erase Execution without Priority Erasure

Figure 9A:
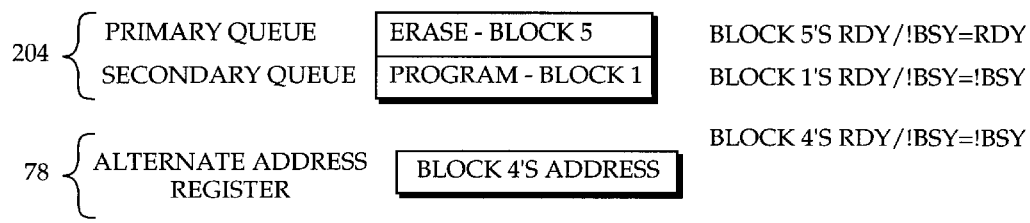
FIG. 9A illustrates the state of the operation queue and the priority register when a program command interrupts erase command execution.

Interrupt handling during erase command execution becomes more complex when the interrupting command is a program command. Consider first the relatively simple situation that occurs when a block erase command has not been received for the same block associated with the interrupting program command. FIG. 9A illustrates such a situation. A program command associated with block 1 has just been placed in the secondary queue during the execution of command to erase block 4. In response, operation queue 204 asserts the signal CMDRDY. The block currently being erased is indicated by alternate address register 78. The placeholder command, erase block 5, remains in the primary queue of operation queue 204.

Sometime after receipt of the command to program block 1 an Interrupt Window 300 is reached. Execution of steps 310, 312 and 314 (FIG. 8) of Interrupt Window 300 proceeds as discussed previously, because the master interrupt flag is enabled and CMDRDY is asserted. Interrupt Window 300 therefore branches to step 316 from step 314.

The command residing in the secondary queue is examined during step 316. Interrupt Window 300 responds to identification of a program command by branching to step 330. Step 330 begins the process of determining whether there are any erase commands that must be executed prior to execution of the program command. This is a multistep step process. Interrupt Window 300 first determines in step 330 whether the block currently being erased is the block that is to be programmed. If so, erasure of the current block is a priority erase and will be completed without interruption, as described below. However, in our example block 4 is currently being erased and the program command is associated with block 1. (Note that the block currently being erased may still be erased prior to execution of the program command even if its erasure is not a priority.) Interrupt window responds by branching from step 330 to step 336.

Interrupt Window 300 determines during step 336 whether the block associated with the program command (i.e., the program block) is ready to be programmed. This determination is made by examining the RDY/!BSY bit associated with the program block. If, as in the current example, an erase command has not been absorbed for the program block; i.e., the RDY/!BSY bit is RDY, then the program block is ready to be programmed. Interrupt Window 300 branches to step 338, to program the program block. Execution of the program command is not interrupted because the program service does not include interrupt windows 300. Interrupt window 300 branches to step 322 after the program command has been executed and cleared from the secondary queue. Interrupt Window 300 is then closed in step 322 by disabling the operation queue interrupt flag and array controller 40 returns to erase execution.

D. Program Command Interruption of Erase Execution with Priority Erasure

Figure 9B:
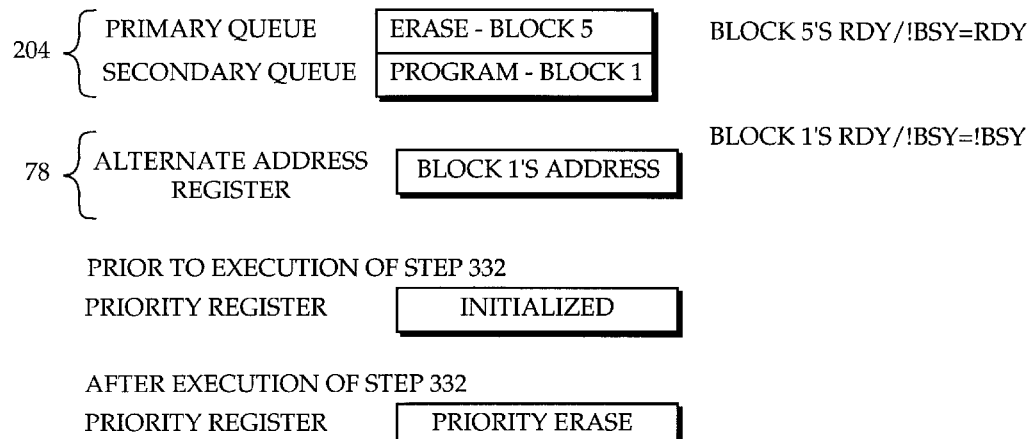
FIG. 9B illustrates the state of the operation queue and the priority register when a program command interrupts erase command execution and the block to be programmed is currently being erased.

Program command interruption of erase command execution becomes more complicated when blocks of memory must be erased prior to program command execution. This can occur in two situations. Consider first the simpler of these two situations: a program command is received for a block that is currently being erased. FIG. 9B illustrates this situation. The secondary queue contains a command to program an address within block 1 and CMDRDY has been asserted. An erase command for block 1 has previously been absorbed, as indicated by the !BSY state of its RDY/BSY bit, and is now being executed, as indicated by its address in alternate address register 78 (FIG. 1). At this point, prior to the execution of step 332 (FIG. 8), the priority register is initialized indicating that a priority erase is not being executed.

The command interruption represented by the assertion of CMDRDY will be handled by the first Interrupt Window 300 reached afterward. Interrupt Window 300 executes steps 310, 312, 314, 316 and branches to step 330 as discussed previously. Interrupt window 300 discovers during step 330 that the block associated with the program command is currently being erased. Thus, the erase command currently being executed must be completed prior to program command execution. In fact, erasure of that block is now a priority. Interrupt Window 300 responds by branching to step 332 where the value in the priority register is changed to indicate that a priority erase is in progress. In one embodiment, the value indicative of a priority erase is 00 (hexadecimal). Afterward, Interrupt Window 300 branches to step 334.

Interrupt Window 300 speeds eventual execution of the program command by preventing any further interruptions in execution of the priority erase command. Interrupt Window 300 accomplishes this by disabling the master interrupt flag in step 334. Interrupt Window 300 then disables the operation queue interrupt flag in step 322 and resumes execution of the interrupted erase command.

Execution of the interrupted, and now priority, erase command, resumes without any further handling of interruptions from operation queue 204. This is because the disabled state of the master interrupt flag causes subsequent Interrupt Windows 300 to branch from step 312 to step 322, skipping interrupt handling. Execution of the priority erase command complete, Erase Controller 240 changes the relevant RDY/!BSY bit to RDY in step 255 (FIG. 6A), indicating that other commands may be performed on the block.

Erase Controller 240 is now free to turn its attention to execution of the program command that caused the priority erase. This is done in step 256 by determining whether a priority erase has just occurred by examining the priority register. In the current example, the priority register indicates that a priority erase just occurred. Erase Controller 240 therefore branches to step 270, where it returns the priority register to its initialized value. Next, in step 272, Erase Controller 240 ensures that the next Interrupt Window 300 reached will handle the program command. Erase Controller 240 does so by enabling the master interrupt flag. In one embodiment, this is done via the command enable interrupt flag command, ENI. Erase Controller 240 then proceeds from step 272 to an Interrupt Window 300.

Block 1 is now ready to be programmed and will be. The execution of Interrupt Window 300 proceeds by branching through steps 310, 312, 314, 330, 336 and 338 (FIG. 8), as discussed previously.

Figure 9C:
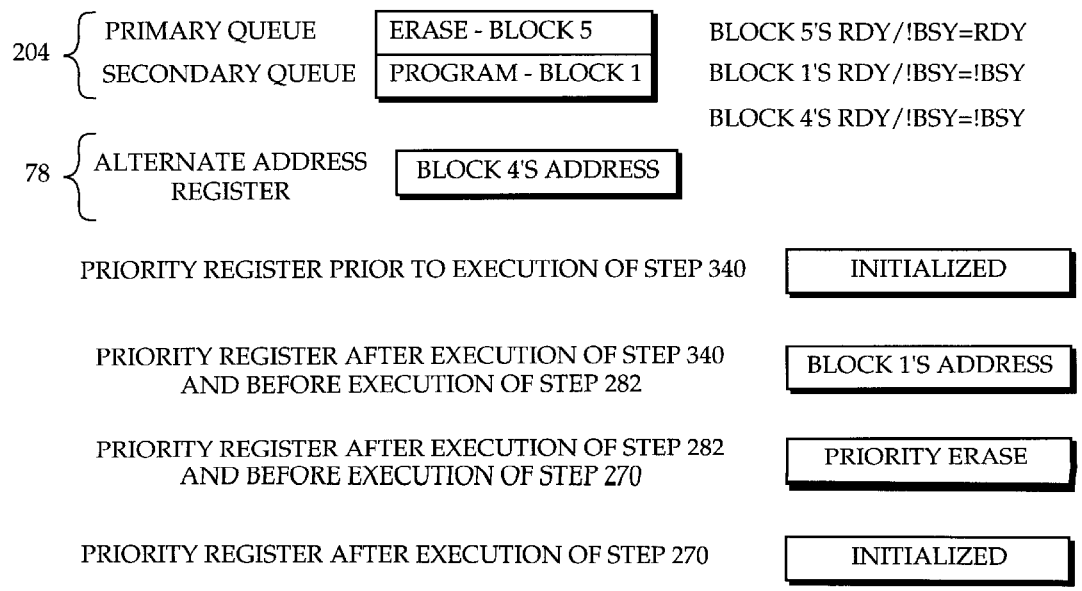
FIG. 9C illustrates the state of the operation queue and the priority register when a program command interrupts erase command execution and an erase command has previously been absorbed for the block to be programmed.

Consider now the second situation in which program command execution must be preceded by execution of previously received block erase commands. This is when a program command is received for a block that has been flagged for erasure but it is not currently being erased. FIG. 9C illustrates this situation. The secondary queue contains a command to program block 1. An erase command for block 1 has been absorbed, as indicated by !BSY state of its RDY/!BSY bit. Block 4 is currently being erased, which is indicated by the !BSY state of its RDY/!BSY bit and its address in alternate address register 78. The priority register is initialized because a priority erase is not currently being executed. Also, the master interrupt flag is enabled and the operation queue interrupt flag is disabled.

When an Interrupt Window 300 is reached after receipt of the program command, Interrupt Window 300 responds to the situation illustrated in FIG. 9C by executing steps 310, 312, 314, 316, 330 and reaching step 336 (FIG. 8), as previously discussed. Interrupt Window 300 discovers during step 336 that the block to be programmed, block 1, is not ready to be programmed because its RDY/!BSY bit indicates prior absorption of an erase command for block 1. This means that not one, but two, erase commands must be executed prior to execution of the program command. (Modification of array controller 40 to allow saving the current state of the non-priority erase command, i.e. the command to erase block 4, would reduce that number to one, only the priority erase command.) Interrupt Window 300 responds to this situation by flagging the block associated with the program command for erasure next. Interrupt Window 300 does so in step 340 by storing the address of the block to be programmed, block 1 in our example, in the priority register. This done, speedy execution of the interrupted erase command, erase block 4 in our example, is ensured by disabling the master interrupt flag in step 342. Interrupt Window 300 then disables the operation queue interrupt flag in step 322 and returns to the interrupted routine.

Execution of the interrupted erase command now precedes without any interruption handling, as discussed previously. Erase Controller 240 once again branches to step 256 (FIG. 6A) to determine whether a priority erase just occurred. One has not according to the current example, therefore Erase Controller 240 branches to step 258 from step 256. Erase Controller 240 determines in step 258 if there is an erase command whose execution is a priority by examining the priority register. According to the example, the priority register indicates that erasure of block 1 is a priority; i.e., block 1 should be erased next. Thus, during step 280 the address stored in the priority register is placed into alternate address register 78 to permit operation upon that block. Erase Controller 240 then changes the value stored in the priority register to indicate that a priority erase is in progress. This is done in step 282.

Erase Controller 240 now begins to erase the block indicated by alternate address register 78 by branching up to step 246. Erasure of this block also occurs without any handling of interruptions from operation queue 204 even though CMDRDY is asserted. This is because the master interrupt flag remains disabled. Erase Controller 240 therefore once again branches to step 256. This time a priority erase has just occurred. Erase Controller 240 handles execution of the program command that caused the priority erase by branching through steps 270, 272 and 300 as discussed previously.

Eventually, there will come a time when all interrupting program commands and absorbed erase commands have been executed. When this occurs, Erase Controller 240 branches from step 264 to step 268. The placeholder command is finally cleared from operation queue 204. Erase Controller 240 then ceases execution until receipt of the next erase command.

Figure 10:
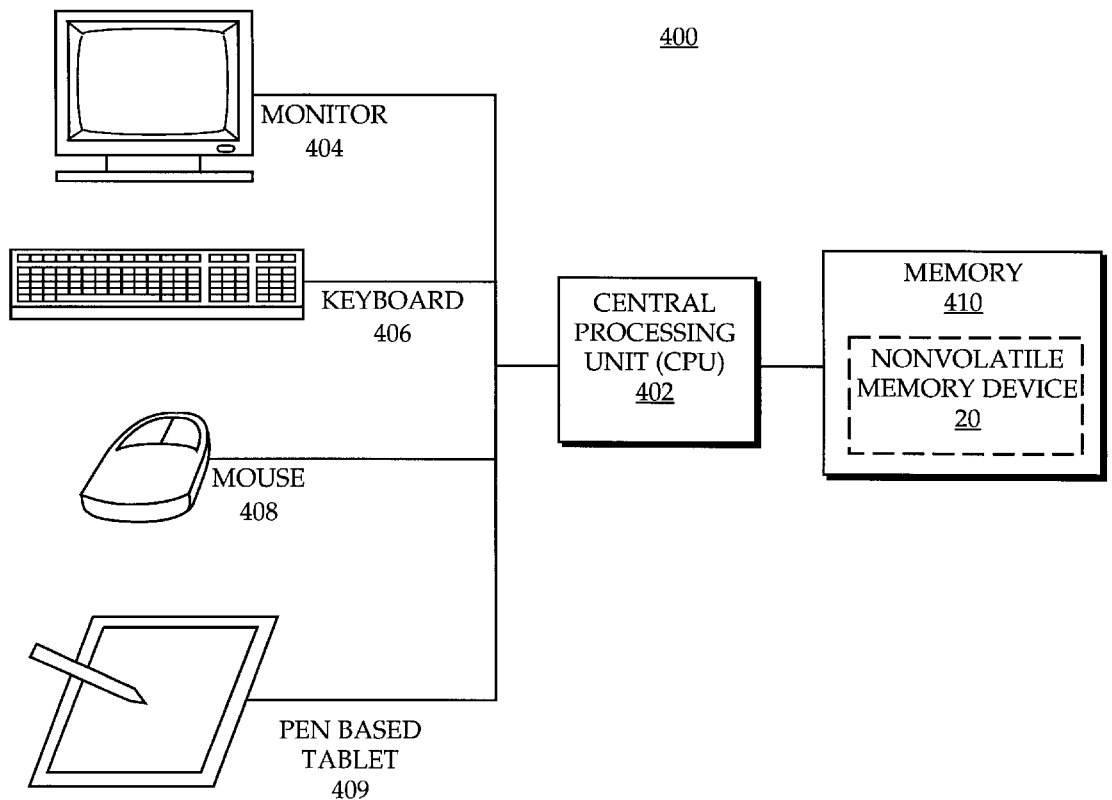
FIG. 10 illustrates a computer system including a nonvolatile memory device that absorbs erase commands.

FIG. 10 illustrates in block diagram form personal computer 400. Personal computer 400 includes central processing unit (CPU) 402 and monitor 404 for visually displaying information to a computer user. The keyboard allows the computer user to input data to CPU 402. By moving mouse 408, the computer user is able to move a pointer displayed on monitor 404. The computer user may also input data to CPU 402 using pen-based tablet 409, which stores data input to it using a stylus, pen, pencil, wand or some other object suited for hand operation. Memory 410 stores data used by CPU 402. Memory 410 typically includes a magnetic disk drive for mass memory storage. Memory also typically includes nonvolatile memory device 20 for storage of data that must be frequently and rapidly accessed.

III. Summary

Thus, a method of interrupting erase command execution to execute a subsequently received program command has been described. A method of absorbing block erase commands has also been described that allows queuing of one block erase command for each block of memory, even though the depth of the operation queue is limited. Prioritization among absorbed block erase commands occurs in response to interrupting program commands.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A method of queuing erase commands for a nonvolatile memory, comprising the steps of:

a) storing a first erase command in an operation queue;
   b) performing the following steps, if a placeholder erase command is already stored in the operation queue, wherein each of the first and placeholder erase commands designates at least one block of the nonvolatile memory to be erased, wherein each block has a corresponding status indicator:
      i) setting the corresponding status indicator for the block designated by the first erase command to indicate that the first erase command is an absorbed erase command; and
      ii) removing the first erase command from the operation queue; and c) designating the first erase command as the placeholder erase command if no placeholder erase command is stored in the operation queue.

2. The method of claim 1 further comprising the steps of:
d) storing a program command in the operation queue;
e) performing the following steps, if the program command designates a same block as any one of the placeholder and absorbed erase commands:
   1) executing an erase operation for the same block;
   2) clearing the corresponding status indicator for the same block associated with the absorbed erase command, if the same block is associated with the absorbed erase command; and
   3) executing the program command.

3. The method of claim 1 further comprising the steps of:
d) storing a program command in the operation queue;
e) performing the following steps, if the program command does not designate a same block as any one of the placeholder and absorbed erase commands:
   1) executing the program command; and
   2) removing the program command from the operation queue.

4. The method of claim 1 further comprising the steps of:
d) erasing the block associated with the placeholder erase command; and
e) erasing the block associated with the absorbed erase command.

5. The method of claim 1 further comprising the steps of:
d) storing a second erase command in the operation queue;
e) setting the corresponding status indicator for the block designated by the second erase command; and
f) removing the second erase command from the operation queue.

6. The method of claim 1 wherein the nonvolatile memory is a flash electrically erasable programmable read only memory.

7. A method of queuing erase commands for a nonvolatile memory having a plurality of individually erasable blocks, comprising the steps of:
a) storing a first erase command in an operation queue;
b) storing a subsequent second erase command in the operation queue, wherein the first and second erase commands designate at least one block of the nonvolatile memory to be erased, wherein each block has a corresponding status indicator;
c) setting the corresponding status indicator for the block associated with the second erase command; and
d) removing the second erase command from the operation queue.

8. The method of claim 7 further comprising the steps of:
e) setting the corresponding status indicator for the block associated with the first erase command; and
f) performing an erase operation on each block having the set corresponding status indicator.

9. The method of claim 7 further comprising the steps of:
e) storing a program command in a second location of the operation queue, wherein the first erase command is stored in a first location of the operation queue;
f) determining an execution priority for the operation queue;
g) executing a higher priority command;
h) executing a lower priority command.

10. The method of claim 7 wherein the operation queue has two storage locations.

11. The method of claim 7 wherein the nonvolatile memory is a flash electrically erasable programmable read only memory.

12. The method of claim 7 further comprising the steps of:
e) storing a program command in the operation queue, wherein the first erase command is stored in a first location of the operation queue, wherein the program command is stored in a second location of the operation queue;
f) determining which of the first and second locations is storing a priority command and which is storing a non-priority command; and
g) executing the priority command.

13. The method of claim 12 further comprising the step of:
h) removing the priority command from the operation queue, wherein the priority command is the program command.

14. The method of claim 13 further comprising the steps of:
i) executing the non-priority command; and
j) removing the non-priority command from the operation queue.

15. The method of claim 14 wherein step i) further comprises the step of executing each of the first and second erase commands, if the non-priority command is the first erase command.

16. A method of queuing erase commands for a nonvolatile memory having a plurality of individually erasable blocks, comprising the steps of:
a) storing a first erase command as a placeholder erase command in an operation queue;
b) absorbing consecutive subsequent erase commands, wherein the first and subsequent erase commands designate at least one block of the nonvolatile memory to be erased, wherein the following steps are performed to absorb each consecutive subsequent erase command:
   1) storing the subsequent erase command in the operation queue;
   2) setting a status indicator for a block associated with the subsequent erase command; and
   3) removing the subsequent erase command from the operation queue.

17. The method of claim 16 further comprising the steps of:
c) storing a program command in the operation queue;
d) executing the program command;
e) returning to step b) to continue to absorb consecutive erase commands subsequent to the program command.

18. The method of claim 16 wherein the nonvolatile memory is a flash electrically erasable programmable read only memory.

* * * * *